Nov. 1, 1966 G. ERKAN 3,283,224

MOLD CAPPING SEMICONDUCTOR DEVICE

Filed Aug. 18, 1965

INVENTOR.

GÜNDÜZ ERKAN,

By His Attorneys

Spensley & Horn.

United States Patent Office 3,283,224

Patented Nov. 1, 1966

3,283,224
MOLD CAPPING SEMICONDUCTOR DEVICE
Gunduz Erkan, Torrance, Calif., assignor to TRW Semiconductors, Inc., Lawndale, Calif., a corporation of California
Filed Aug. 18, 1965, Ser. No. 480,577
2 Claims. (Cl. 317—234)

This invention relates to semiconductor devices and more particularly to a semiconductor encapsulation technique using a molded cap.

Semiconductor junction devices are very sensitive to overloading or excessive junction temperature, for which reason it has become known to mount the devices upon a stud or base of heat conductive material which either acts as a heat sink or as a means of mounting the device to a heat sink. The present invention is directed toward structural improvements in this type of semiconductor device.

In accordance with the present invention technique a header member of electrical insulating material has spaced-apart electrical contact regions on its upper surface, the semiconductor crystal being mounted with a region of one conductivity type in ohmic connection with one of the electrical contact regions and being provided with a lead wire or lead wires ohmically connecting its region of opposite conductivity type or regions of opposite and similar conductivity types with other electrically isolated contact region or regions. A separate electroconductive lead is connected to each of the electrical contact regions such that one end of the ribbon lead projects beyond the header member. A solid plastic cap is molded over the upper portion of the header member to embed the electrical contact regions, the semiconductor body and lead wires, and the secured ends of the ribbon leads, whereby only the projecting ends of the ribbon leads and the lower portion of the header member are exposed. The plastic encapsulating cap is conveniently formed by transfer moldings. The surfaces to be encapsulated can conveniently be covered with a buffer coating prior to molding to absorb thermal and mechanical stresses during the molding process and to equalize molding pressure so that critical or physically weak structural components are not strained. Thus, the completed device is solid and void-free, thereby eliminating the possibility of migration of loose particles within the device, increasing radiation resistance by eliminating the usual pocket of ionizable gas, and solidly embedding the semiconductor crystal and delicate internal leads.

Accordingly, it is an object of the present invention to provide an improved semiconductor device.

It is also an object of the present invention to provide an improved semiconductor device of the type utilizing a heat conductive header.

It is another object of the present invention to provide an improved semiconductor packaging technique.

It is still another object of the present invention to provide an improved semiconductor fabrication technique utilizing a mold capping method.

It is a still further object of the present invention to provide a mounting header for a semiconductor device intended for use at very high frequencies and at high power levels.

It is also an object of the present invention to provide a semiconductor device encapsulated with a molded plastic cap, and wherein only a minor part of the total heat dissipation of the device occurs through electrical ribbon leads protruding through the encapsulation.

The novel features which are believed to be characteristic of the invention, both as to its organization and method of operation, together with further objects and advantages thereof will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

Figures 1, 2, 5:
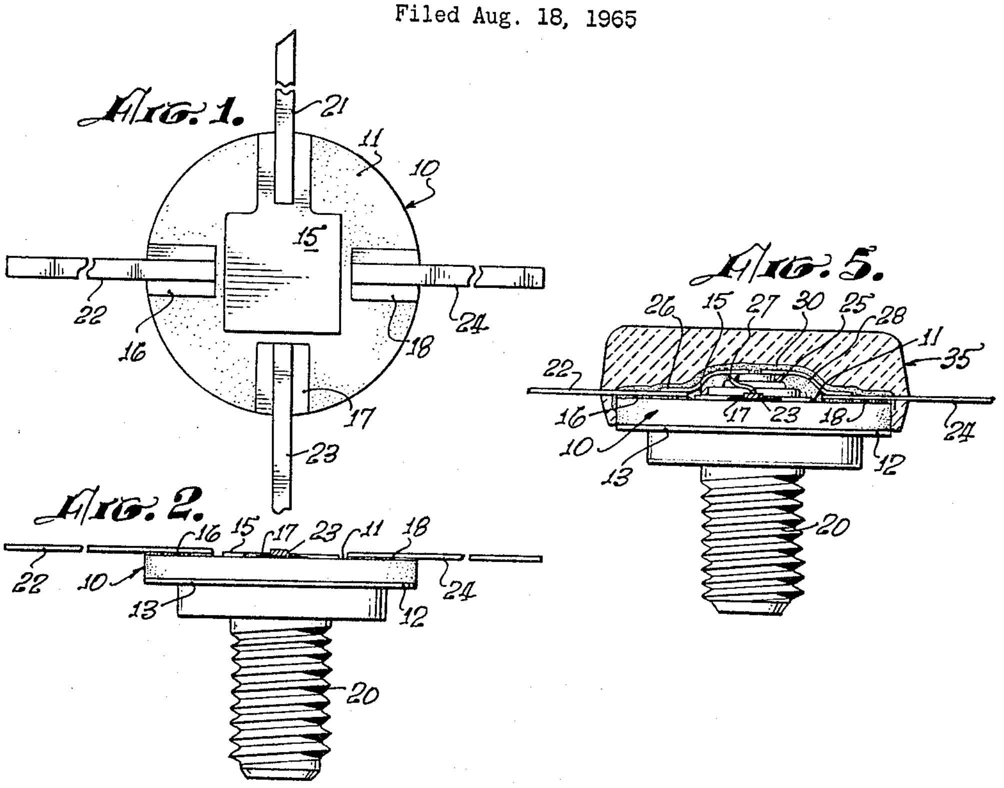
FIGURE 1 is a plan view of a semiconductor mounting structure.
FIGURE 2 is an elevation view of the structure shown in FIGURE 1.
FIGURE 5 is an elevational view, partly in section, of the completed semiconductor device.

Referring to the drawings, and in particular to FIGURES 1 and 2, the present invention mounting structure includes a disc 10 of heat conductive, electrical insulating material, preferably beryllia or other suitable ceramic. The disc 10 defines an upper surface 11 and a lower surface 12, a thin layer of metal 13 being established on the lower surface 12 by chemi-plating or other suitable metalizing technique. The upper surface 11 is also metalized in a predetermined pattern to thereby define a die mounting pad 15 and spaced apart electrical contacts 16, 17 and 18.

A heat sink stud 20 is brazed to the metalized lower surface of the disc 10, the stud 20 being preferably copper or a low thermal resistance alloy. Alternatively, the stud 20 may be of a heat conductive, electrical insulating material, and can be formed integral with the disc 10 (the metal layer 13 then being unnecessary). A series of four electroconductive ribbon leads 21–24 are secured in low resistance ohmic contact to the various metalized regions on the upper surface 11 of the disc 10, such as by brazing, for example. Of course any number of leads may be used depending on the nature of the device (e.g., typically two for a diode). Further, alternatively it will be understood that the disc may be directly affixed to a heat conductive surface. As can best be seen in FIGURE 1 the ribbon leads are attached at one of their ends and oriented so that they project radially beyond the disc 10, the ribbon lead 21 being bonded to the die mounting pad 15, the ribbon lead 22 being bonded to the electrical contact 16, the ribbon lead 23 bonded to the electrical contact 17, and the ribbon lead 24 bonded to the electrical contact 18. At this stage of fabrication the mounting structure is ready to receive the semiconductor crystal which forms the heart of the PN junction device.

Figures 3, 6:
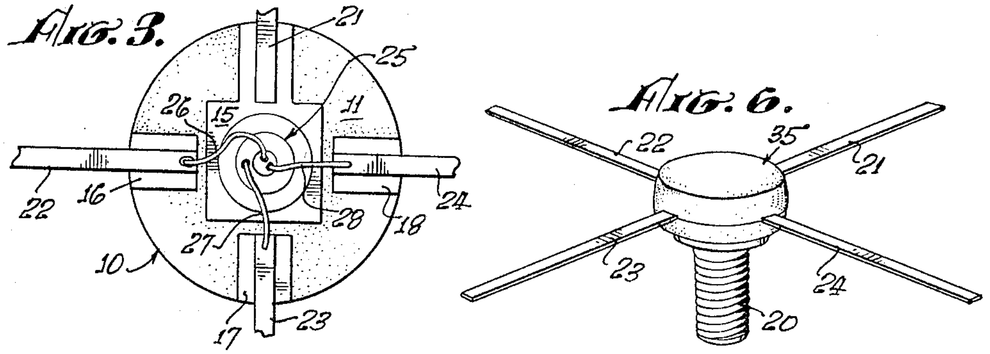
FIGURE 3 is a plan view of the mounting structure of FIGURE 1 with a semiconductor crystal mounted thereon.
FIGURE 6 is a perspective view of the completed semiconductor device.

FIGURE 3 of the drawing shows the structure of FIGURES 1 and 2 to which is mounted a semiconductor crystal wafer, generally indicated by the reference numeral 25. In the illustrated embodiment the crystal wafer 25 comprises a disc shaped wafer or die of N-type silicon into the upper surfaces of which are diffused atoms of P-type and subsequently N-type active impurities in such configuration so as to form a so-called planar NPN transistor structure. The general configuration of such planar structures and suitable fabrication techniques to form them are well known in the art and will not be discussed in detail, beyond stating that the lower surface of the wafer defines an N-type collector region while N-type emitter and P-type base regions are defined in its upper surface. The lower surface of the semiconductor crystal wafer 25 is bonded in low resistance ohmic contact to the larger central portion of the die mounting pad 15, thereby establishing the ribbon lead 21 as the collector terminal of the transistor. Contact leads 26 and 28 of fine wire are ohmically bonded to the N-type emitter region on the upper surface of the crystal and to the ribbon leads 22 and 24 respectively, thereby establishing the ribbon leads 22 and 24 as the transistor dual emitter leads. The ribbon lead 23 is established as the transistor base terminal by bonding a whisker lead 27 to the ribbon lead 23 and to the P-type base region defined on the upper surface of the crystal wafer. The desired ohmic contact can be achieved by thermo-compression bonding the whisker leads 26–28 to the semiconductor crystal wafer 25 and welding them to the ribbon leads. The sub-assembly at this stage of fabrication will then appear as shown in FIGURE 3.

Figure 4:
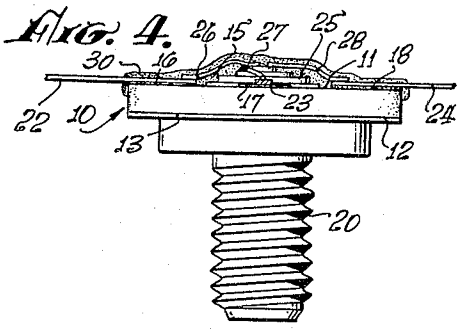
FIGURE 4 is an elevation view of the structure shown in FIGURE 3 after the addition of a buffer coating over the uppermost portion of the structure.

Next, the sub-assembly is buffer coated by forming a soft elastic coating 30 of silicone resin, or other suitable polymer, over the semiconductor wafer, the whisker leads, the electrical contact regions and die mounting pad, and exposed upper surface portions of the disc 10. This coating can be conveniently applied with a small brush. Upon application of the buffer coating 30, the sub-assembly will appear as shown in FIGURE 4. The purpose of the buffer coating is to provide a soft and elastic medium surrounding the semiconductor crystal and the fine wire internal lead connections so that subsequently applied molding pressure, or any thermal strain that would be developed in the solid molded package, will be absorbed by the elastic material so that strain will not be applied or transferred directly to critical and physically weak structural components.

The buffer coated sub-assembly is then loaded into a mold and a plastic cap (silicone molding compound) 35 is transfer molded over the upper portion of the disc 10, contiguous with the coating 30 to thereby effectively embed the electrical contact regions and die mounting pad, the semiconductor wafer and whisker leads, and the secured ends of the ribbon leads. Thus, only the free ends of the ribbon leads protrude from the molded cap, while the stud 20 is exposed beneath the plastic cap, as shown in FIGURES 5 and 6 of the drawing.

The finished package is solid and void-free, thereby eliminating the possibility of migration of loose particles in the area of the semiconductor wafer that could cause short circuits. The embedding of the whisker leads forming the internal connections of the device greatly increases the resistance of the device to shock and vibration. The presence of the buffer coating absorbs the thermal shock, thereby contributing to a more rugged device.

Power transistors constructed in accordance with the present invention technique for operation at 150 megacycles with a power rating of 10 watts under pulse conditions, have exhibited the following characteristics:

*Maximum ratings*

| | |
|---|---|
| Storage temperature | −65° C. to 200° C. |
| Operating junction temp. | −65° C. to 200° C. |
| Lead temperature (1/16 from cap for 10 sec.) | 230° C. |
| Total dissipation at cap temperature | 25° C. ($V_{CE}$=28 v.) 20 watts. |
| Thermal resistance (junction to cap) | 8/75° C./w. |
| Collector to base voltage | 70 v. D.C. |
| Collector to emitter voltage ($R_B$=10Ω) | 70 v. D.C. |
| Collector to emitter voltage ($I_c$=50 ma.) | 40 v. D.C. |
| Emitter to base voltage | 4.0 v. D.C. |
| D.C. collector current, continuous | 1.2 a. D.C. |
| D.C. base current, continuous | 0.5 a. D.C. |

Although the invention has been described with a certain degree of particularity, it is understood that the present disclosure has been made only by way of example and that numerous changes in the details of construction, the selection of materials, and the combination and arrangement of parts may be resorted to without departing from the spirit and the scope of the invention as hereinafter claimed, for example, devices with one or more PN junctions may be housed in the present invention semiconductor package.

What is claimed is:

1. A semiconductor device comprising:

(a) a header member of electrical insulating heat conductive material having a uniplanar upper surface and a lower surface, the lower surface of said header member defining a broad area contact for the conduction of heat from said header body to a heat sink;

(b) a thin layer of electroconductive material established on spaced apart portions of the uniplanar upper surface of said header member to define first and second electrical contact regions;

(c) a body of semiconductor material containing at least one PN junction, said body of semiconductor material being mounted with a portion thereof in ohmic connection with said first electrical contact region and being provided with a lead wire ohmically connecting another portion thereof with said second electrical contact region;

(d) a first electroconductive lead having one of its ends secured in ohmic contact with said first electrical contact region and having its other end projecting beyond said header member;

(e) a second electroconductive ribbon lead having one of its ends secured in ohmic contact with said second electrical contact region and having its other end projecting beyond said header member;

(f) a buffer coating of elastic material disposed over said semiconductor material and surrounding the free portion of said lead wire; and (g) a solid plastic cap molded over the upper portion of said header member to cover said buffer coating, said electrical contact regions, said semiconductor body and lead wire and the secured ends of said first and second ribbon leads to thereby expose only the free ends of said ribbon leads and the lowermost portion of said header member including said lower surface.

2. A semiconductor device comprising:

(a) a header member of electrical insulating heat conductive material having a uniplanar upper surface and a lower surface, the lower surface of said header member defining a broad area contact for the conduction of heat from said header body to a heat sink;

(b) a thin layer of electroconductive material established on spaced apart portions of the uniplanar upper surface of said header member to define first and second electrical contact regions;

(c) a body of semiconductor material containing at least one PN junction, said body of semiconductor material being mounted with a region of one conductivity type in ohmic connection with said first electrical contact region and being provided with a lead wire ohmically connecting a region of opposite conductivity type with said second electrical contact region;

(d) a first electroconductive lead having one of its ends secured in ohmic contact with said first electrical contact region and having its other end projecting beyond said header member;

(e) a second electroconductive ribbon lead having one of its ends secured in ohmic contact with said second electrical contact region and having its other end projecting beyond said header member;

(f) a buffer coating of elastic material disposed over said semiconductor material and surrounding the free portion of said lead wire; and (g) a solid plastic cap molded over the upper portion of said header member to cover said buffer coating, said electrical contact regions, said semiconductor body and lead wire, and the secured ends of said first and second ribbon leads to thereby expose only the free ends of said ribbon leads and the lowermost portion of said header member including said lower surface.

References Cited by the Examiner

UNITED STATES PATENTS

| | | | |
|---|---|---|---|
| 2,750,654 | 6/1956 | Owens | 29—25.3 |
| 2,888,736 | 6/1959 | Sardella | 29—25.3 |
| 2,937,960 | 5/1960 | Pankove | 148—1.5 |
| 2,948,835 | 8/1960 | Runyon | 317—234 |
| 2,985,806 | 5/1961 | McMahon et al. | 29—25.3 X |
| 3,195,026 | 7/1965 | Wegner et al. | 317—234 |
| 3,199,001 | 8/1965 | Dyben | 317—234 |
| 3,231,797 | 1/1966 | Koch | 317—235 |

JOHN W. HUCKERT, *Primary Examiner.*

M. EDLOW, *Assistant Examiner.*